United States Patent [19]

Noguchi et al.

[11] Patent Number: 5,696,177
[45] Date of Patent: Dec. 9, 1997

[54] ACTIVE ENERGY RAY-CURING RESIN COMPOSITION

[75] Inventors: Hiromichi Noguchi, Atsugi; Tadayoshi Inamoto, Machida; Megumi Munakata, Atsugi, all of Japan

[73] Assignee: Canon Kabushiki Kaisha, Tokyo, Japan

[21] Appl. No.: 240,502

[22] Filed: May 10, 1994

Related U.S. Application Data

[63] Continuation of Ser. No. 35,898, Mar. 23, 1993, abandoned, which is a continuation of Ser. No. 859,626, Mar. 20, 1992, abandoned, which is a continuation of Ser. No. 245,939, Sep. 19, 1988, abandoned, which is a continuation of Ser. No. 874,414, Jun. 16, 1986, abandoned.

[30] Foreign Application Priority Data

Jun. 18, 1985 [JP] Japan ............................. 60-132488
Jun. 18, 1985 [JP] Japan ............................. 60-132493

[51] Int. Cl.⁶ .................................................. C08F 2/46
[52] U.S. Cl. ....................... 522/31; 522/14; 522/102
[58] Field of Search .............................. 522/102, 31, 14

[56] References Cited

U.S. PATENT DOCUMENTS

| | | | |
|---|---|---|---|
| 3,382,297 | 5/1968 | Thompson | 525/94 |
| 3,450,613 | 6/1969 | Steinberg | 522/103 |
| 3,607,977 | 9/1971 | Taylor | 525/94 |
| 3,655,826 | 4/1972 | Fellman et al. . | |
| 3,711,575 | 1/1973 | Kakefuda et al. . | |
| 3,764,324 | 10/1973 | Reyes | 522/102 |
| 4,148,967 | 4/1979 | Satoh | 522/102 |
| 4,163,809 | 8/1979 | McGinniss | 522/102 |
| 4,181,581 | 1/1980 | Iwata | 525/94 |
| 4,299,938 | 11/1981 | Green | 522/31 |
| 4,366,289 | 12/1982 | Keskkula | 525/94 |
| 4,394,670 | 7/1983 | Sugitani et al. . | |
| 4,412,224 | 10/1983 | Sugitani . | |
| 4,417,251 | 11/1983 | Sugitani . | |
| 4,429,076 | 1/1984 | Saito | 525/94 |
| 4,437,100 | 3/1984 | Sugitani et al. . | |
| 4,509,063 | 4/1985 | Sugitani et al. . | |
| 4,521,787 | 6/1985 | Yokota et al. . | |
| 4,524,183 | 6/1985 | Weber | 525/118 |
| 4,533,975 | 8/1985 | Bill . | |
| 4,554,322 | 11/1985 | Kwiecinski . | |
| 4,593,067 | 6/1986 | Nakayama | 525/92 |
| 4,688,052 | 8/1987 | Inamoto et al. . | |
| 4,688,053 | 8/1987 | Noguchi et al. . | |
| 4,688,054 | 8/1987 | Inamoto et al. . | |
| 4,688,055 | 8/1987 | Noguchi et al. . | |
| 4,688,056 | 8/1987 | Noguchi et al. . | |

FOREIGN PATENT DOCUMENTS

| | | |
|---|---|---|
| 2411753 | 10/1975 | Germany . |
| 2610437 | 9/1976 | Germany . |
| 47-47865 | 2/1972 | Japan . |
| 57-87409 | 5/1982 | Japan . |

OTHER PUBLICATIONS

Skeist, Irving, Handbook of Adhesives, N.Y.: Reinhold Publishing Corporation, Chapman & Hall, Ltd., 1962, p. 323.

*Primary Examiner*—Mark Chapman
*Attorney, Agent, or Firm*—Fitzpatrick, Cella, Harper & Scinto

[57] ABSTRACT

An active energy ray-curable resin composition comprises:

(i) a linear polymer having a glass transition temperature at least equal to 50° C. and a weight-average molecular weight of at least about $3.0 \times 10^4$; and (ii) a resin obtained by esterifying, with an unsaturated carboxylic acid, a part of epoxy groups present in an epoxy resin comprising at least one compound having at least two epoxy groups in a molecule.

20 Claims, No Drawings

ACTIVE ENERGY RAY-CURING RESIN COMPOSITION

This application is a continuation of application Ser. No. 08/035,898, filed Mar. 23, 1993, now abandoned; which in turn, is a continuation of application Ser. No. 07/859,626, filed Mar. 20, 1992, now abandoned; which in turn, is a continuation of application Ser. No. 07/245,939, filed Sep. 19, 1988, now abandoned; which in turn, is a continuation of application Ser. No. 06/874,414, filed Jun. 16, 1986, now abandoned.

BACKGROUND OF THE INVENTION

1. Field of the Invention

The present invention relates to a resin composition curable by irradiation with active energy ray, such as ultraviolet light or electron beam, and in particular to an active energy ray-curable resin composition which is capable of pattern formation and is excellent in adhesion to substrates, such as glass, ceramics or plastic film, chemical resistance and mechanical strength. The resin composition can be adapted for forming a photosensitive dry sheet or film.

2. Related Background Art

Active energy ray-curable resins are recently widely employed in paints, inks, sealing materials, resists and pattern forming materials. In the field of pattern forming materials, the active ray-curable resins were initially employed in the manufacture of printing plates but are currently utilized not only in the electronic industry, such as the preparation of printed wiring boards and integrated circuits, but also as structural material for precision apparatuses such as ink jet recording heads, as disclosed in the Japanese Laid-open Patent Application No. 57-43876.

However, none of the conventionally known active energy ray-curable resins, particularly those formed as dry films, shows satisfactory adhesion to substrate such as glass, ceramics or plastic film. On the other hand, those employed as light-curable paints or adhesives for glass, metals, ceramics etc. have acceptable adhesion to the substrate when cured, but require prolonged or strong irradiation with an active energy ray and are generally not provided with properties suitable for pattern formation. With such resins it has not been possible to obtain precise patterns of a high resolution by irradiation in patterns with active energy ray and removal of the unexposed area by image development.

In this manner there has not been known, in the prior art, a resin that is capable of forming a precise pattern of excellent adhesion on various substrates, with high durability as a structural material in the pattern.

SUMMARY OF THE INVENTION

An object of the present invention is to provide an active energy ray-curable resin composition provided with excellent adhesion to substrates and capable of forming precise patterns of a high resolution that has not been achieved in the prior art.

Another object of the present invention is to provide an active energy ray-curable resin composition capable of being formed as a dry film convenient for pattern formation and also capable of providing a pattern, formed by irradiation of an active energy ray eventually combined by a heating treatment, excellent in chemical resistance and mechanical strength and highly durable as a structural material.

According to the present invention, there is provided an active energy ray-curable resin composition comprising, as essential components, (i) a linear polymer having a glass transition temperature at least equal to 50° C. and a weight-average molecular weight at least equal to ca. $3.0 \times 10^4$, and (ii) an epoxy resin which comprises at least a compound having at least two epoxy groups and in which a part of the epoxy groups present in said epoxy resin is esterified with an unsaturated carboxylic acid.

DESCRIPTION OF THE PREFERRED EMBODIMENTS

The active energy ray-curable resin composition of the present invention contains, as an essential component (i), a linear polymer having a glass transition temperature at least equal to 50° C. and a weight-average molecular weight at least equal to ca. $3.0 \times 10^4$ for maintaining the composition as a dry film and providing the cured pattern with satisfactory mechanical strength.

If the glass transition temperature and the weight-average molecular weight of the linear polymer do not reach the above-mentioned limits, a satisfactory dry film cannot be obtained since the composition formed as a dry resin layer on a substrate such as a plastic film at manufacture may gradually flow during storage to form wrinkles or to develop unevenness in layer thickness.

Examples of such linear polymers include thermoplastic copolymers principally composed of (A) a monomer of which its homopolymer has relatively rigid properties to provide the above-mentioned glass transition temperature, and optionally a second monomer component of hydrophilic nature to improve the adhesion of the composition of the present invention, within an amount not exceeding 40 mol. %, such as (B) a hydroxyl group containing acrylic monomer, (C) an amino or alkylamino group containing acrylic monomer, (D) a carboxyl group containing acrylic or vinyl monomer, (E) N-vinylpyrrolidone or a derivative thereof, (F) vinylpyridine or a derivative thereof, or (G) a monomer represented by the following formula:

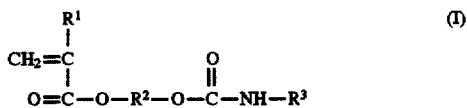

and capable of providing the composition of the present invention with a strong coagulating strength thereby improving the mechanical strength of the composition, wherein $R^1$ is hydrogen or alkyl having 1 to 3 carbon atoms; $R^2$ is a bivalent hydrocarbon group which may contain therein an ether bond or may be substituted with halogen atoms; $R^3$ is alkyl having 3 to 12 carbon atoms, phenylalkyl or phenyl.

Examples of the monomer employable as the component (A) are alkyl methacrylates containing 1 to 4 carbon atoms in the alkyl radical such as methyl methacrylate, ethyl methacrylate, isobutyl methacrylate or t-butyl methacrylate; acrylonitrile and styrene. These monomers are preferably contained in an amount of 60 mol. % or higher in order to achieve the above-mentioned glass transition temperature in the linear copolymer.

In the following there are shown examples of the monomers (B)-(G) employed as the second component. Examples of the hydroxyl group-containing acrylic monomer (B) are 2-hydroxyethyl (meth)acrylate [hereinafter (meth)acrylate means both acrylate and methacrylate], 2-hydroxypropyl (meth) acrylate, 3-chloro-2-hydroxypropyl (meth)acrylate, 4-hydroxybutyl (meth)acrylate, 3-hydroxybutyl (meth) acrylate, 5-hydroxypentyl (meth) acrylate, 6-hydroxyhexyl (meth) acrylate; a monoester of 1,4-cyclohexanedimethanol and acrylic or methacrylic acid; a product known under a trade name of Aronix M5700 produced by Toa Gosei Kagaku Co., Ltd.; caprolactone acrylate known under a trade name of TONE M100 produced by Union Carbide Co.; a product known under a trade name of Light Ester HO-mpp produced by Kyoei Yushi Kagaku Co., Ltd.; 2-hydroxy-3-phenoxypropyl acrylate known under a trade name of Light Ester M-600A produced by Kyoei Yushi Kagaku Co., Ltd.; dihydric alcohols such as 1,10-decandiol, neopentylglycol, or bis (2-hydroxyethyl) terephthalate; and monoesters of addition products of bisphenol-A and ethylene oxide or propylene oxide and (meth)acrylic acid.

Examples of the amino—or alkylamino-group containing acrylic monomer (C) are (meth)acryl amide, N,N-dimethylaminoethyl- (meth) acryl amide, N,N-dimethyl-(meth) acryl amide, N,N-dimethylaminopropyl- (meth) acryl amide, and N,N-di-t-butylaminoethyl- (meth) acryl amide.

Examples of the carboxyl group containing acrylic or vinyl monomer (D) are (meth)acrylic acid, fumalic acid, itaconic acid, and products known under a trade name of Aronix M-5400 or Aronix-M-5500 produced by Toa Gosei Kagaku Co., Ltd.

Examples of the vinyl pyridine or derivative thereof (F) are 2-vinylpyridine, 4-vinylpyridine, 2-vinyl-6-methylpyridine, 4-vinyl-1-methylpyridine, 2-vinyl-5-ethylpyridine and 4-(4-piperidinoethyl) -pyridine.

The above-mentioned monomers (B)-(F) are all hydrophilic and provide the composition of the present invention with strong adhesion to substrates such as glass, ceramics, plastics etc.

Examples of the monomer (G) represented by the general formula (1) are (α-alkyl)acrylic acid esters having at least one urethane bond in the molecule, obtained by reacting (α-alkyl)acrylic acid ester, containing a hydroxyl group in the molecule, with a monoisocyanate compound. $R^2$ in the general formula (1) can be an arbitrary bivalent hydrocarbon group which may contain therein an ether bond and may be substituted with halogen atoms, but preferred examples of $R^2$ are alkylene having 2 to 12 carbon atoms and may be substituted with halogen atoms, an alicyclic hydrocarbon group such as 1,4-bismethylenecyclohexane, and a hydrocarbon group containing aromatic ring(s) such as bisphenyldimethylmethane.

Examples of the (meth)acrylic ester containing at least one hydroxyl group in the molecule, employed in the preparation of the monomer represented by the general formula (1) are 2-hydroxyethyl (meth) acrylate, 2-hydroxypropyl (meth) acrylate, 3-chloro-2-hydroxypropyl (meth) acrylate, 4-hydroxybutyl (meth) acrylate, 3-hydroxybutyl (meth)acrylate, 5-hydroxypentyl (meth)-acrylate, 6-hydroxyhexyl (meth)acrylate and a product known under a trade name of Light Ester HO-mpp produced by Kyoeisha Yushi Kagaku Kogyo Co., Ltd. In addition to the foregoing, examples of (α-alkyl)acrylic acid ester containing a hydroxyl group in the molecule include (a) esters of aliphatic or aromatic dihydric alcohols and (meth)acrylic acid, and (b) (meth)acrylic acid esters of monoepoxy compounds.

Examples of the dihydric alcohol to be employed in (a) mentioned above include 1,4-cyclohexanedimethanol, 1,10-decanediol, neopentylglycol, bis(2-hydroxyethyl)-terephthalate, and addition products of 2 to 10 moles of ethylene oxide or propylene oxide to bisphenol-A. Also examples of the monoepoxy compound to be employed in (b) mentioned above include a product known under the trade name of Epolite M-1230 produced by Kyoeisha Yushi Kagaku Kogyo Co., Ltd., phenylglycidylether, cresylglycidylether, butylglycidylether, octylene oxide, and n-butylphenol glycidylether.

Also examples of the monoisocyanate compound employed in the preparation of the monomer represented by the general formula I include alkylmonoisocyanates obtained by attaching an isocyanate group to an alkyl having 3 to 12 carbon atoms, phenylisocyanate and cresylmonoisocyanate.

The monomer represented by the general formula (I) is preferably contained in the linear copolymer in a content not exceeding 40 mol. %. A content exceeding 40 mol. % gives rise to a marked lowering of the softening point of the composition, thus leading to a loss in the surface hardness of the pattern obtained by curing the composition or a loss in the chemical resistance by swelling.

The composition of the present invention can be employed in various forms such as solution or solid film (dry film) according to the purpose, but the use as a dry film is particularly advantageous because of ease of handling and of control of thickness, though the use as solution is naturally possible.

In the foregoing there has principally been explained the use of a thermoplastic linear polymer, but it is also possible, in the present invention, to employ a thermo- or photo-crosslinkable polymer.

A thermo-crosslinkable linear polymer can be obtained for example by introducing, into the above-mentioned thermoplastic linear polymer, a thermo-crosslinkable monomer represented by the following general formula II as the second component of copolymerization:

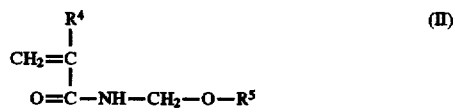

wherein $R^4$ is hydrogen or alkyl or hydroxyalkyl having 1 to 3 carbon atoms, and $R^5$ is hydrogen or alkyl or acyl having 1 to 4 carbon atoms and optionally containing hydroxyl group(s). The monomer represented by the general formula II is not only thermo-crosslinkable but also hydrophilic, thus providing the composition of the present invention with excellent properties such as heat resistance, chemical resistance and mechanical strength by the thermo-crosslinking property and excellent adhesion to a substrate by the hydrophilicity.

Examples of the monomer represented by the general formula II include acrylamide derivatives such as N-methylol (meth)acrylamide [hereinafter (meth)-acrylamide includes acrylamide and methacrylamide], N-propoxymethyl (meth) acrylamide, N-n-butoxymethyl (meth) acrylamide, β-hydroxyethoxymethyl (meth) acrylamide, N-ethoxymethyl (meth) acrylamide, N-methoxymethyl (meth) acrylamide, N-acetoxymethyl (meth) acrylamide, α-hydroxymethyl-N-methylol acrylamide, α-hydroxyethyl-N-butoxymethyl acrylamide, α-hydroxypropyl-N-propoxy-methyl acrylamide, α-ethyl-N-methylolacrylamide, and α-propyl-N-methylol acrylamide.

The monomer represented by the above-mentioned general formula II is provided not only with hydrophilicity but also condensing crosslinkable property by heating, and liberates water or alcohol molecules at a temperature of 100° C. or higher to form crosslinking bonds, thereby causing the linear copolymer itself to form a network structure after curing and thus providing the cured pattern with excellent chemical resistance and mechanical strength.

In case of using a thermosetting linear polymer, the monomer represented by the general formula II is preferably contained therein in a range from 5 to 30 mol. %. A content within the above-mentioned range provides a sufficient chemical resistance-resulting from thermal curing, but a content exceeding 30 mol. % results in a fragile pattern after curing.

Instead of the monomer represented by the above-mentioned general formula II, there may also be employed, as the component of copolymerization, a monomer capable of crosslinking by thermally opening a ring, such as glycidyl (meth)acrylate, to achieve similar effect.

A photo-crosslinkable linear polymer can be obtained by introducing a photopolymerizable monomer into a linear polymer for example by:

(i) the method in which a carboxyl containing monomer exemplified by (meth)acrylic acid, etc., or an amino or tertiary amine containing monomer is copolymerized, followed by the reaction with glycidyl(meth)-acrylate, etc.;

(j) the method in which a partial urethane compound of polyisocyanate having one isocyanate group and one or more acrylic ester groups in one molecule is reacted with the hydroxyl group, amino group or carboxyl group in the graft chain;

(k) the method in which acrylic acid chloride is reacted with the hydroxyl groups in the graft chain;

(l) the method in which an acid anhydride is reacted with the hydroxyl group in the graft chain, followed by the reaction with glycidyl(meth)acrylate;

(m) the method in which the hydroxyl group in the graft chain is condensed with the condensing cross-linkable monomer as exemplified above, thereby leaving acrylamide group in the side chain;

(n) the method in which the hydroxyl group in the graft chain is reacted with glycidyl(meth)acrylate; etc.

When the linear polymer in the present invention is heat crosslinkable, it is preferable to perform heating after formation of a pattern by irradiation of an active energy ray. On the other hand, also when the above linear polymer is photopolymerizable, there is no problem in performing heating within the range permissible with respect to the heat resistance of the substrate, and rather preferable results can be obtained by heating.

The linear polymers employable in the present invention can be roughly classified, as explained above, into those without curing property, those with photo-crosslinking property and those with thermo-crosslinking property, but any of them is capable, in the curing process of the composition of the present invention (i.e. pattern formation by the irradiation of an active energy ray optionally followed by thermal curing) of precise patterning by imparting form maintaining property to the composition, and also gives excellent adhesiveness, and chemical resistance as well as high mechanical strength to the pattern obtained by curing.

The resin component (ii) obtained by esterifying a part of the epoxy groups existing in the epoxy resin comprising one or more compound having two or more epoxy groups in one molecule with an unsaturated carboxylic acid to be used as another component in the present invention (hereinafter abbreviated as half-esterified epoxy resin) is a component which permits the composition of the present invention to exhibit curability with an active energy ray and, in addition thereto, imparts better adhesiveness with a substrate, water resistance, chemical resistance, dimensional stability, etc., to the cured film formed by coating the resin composition of the present invention in liquid state on various substrates comprising glass, plastics, ceramics, etc., followed by curing, or to the cured film formed by adhering the resin composition in the form of a dry film on various substrates.

The half-esterified epoxy resin (ii) to be contained in the resin composition of the present invention can be obtained by, for example, reacting an epoxy resin with a predetermined amount of an unsaturated carboxylic acid in the co-presence of an addition catalyst and a polymerization inhibitor, in the presence or absence of a solvent, under the temperature condition of 80° to 120° C., thereby esterifying a part of the epoxy groups existing in the epoxy resin with the carboxylic acid.

Examples of the epoxy resin comprising one or more compounds containing 2 or more epoxy groups in one molecule which can be used for formation of the half-esterified epoxy resin (ii) include epoxy resins as represented by the bisphenol A type, novolac type, alicyclic type, or polyfunctional epoxy resins such as bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxy-urethane resins represented by the following formula III:

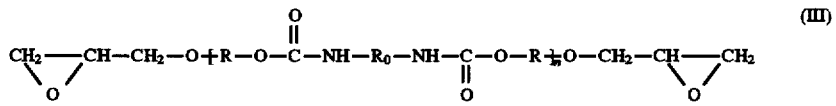

(wherein R represents an alkyl group or an oxyalkyl group, $R_0$ represents

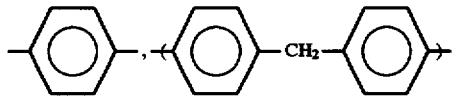

or an alkyl group), and mixtures of at least one of these.

Specific examples of these polyfunctional epoxy resins include those as mentioned below. That is, the bisphenol A type epoxy resin may be, for example, Epicoat 828, 834, 871, 1001, 1004 (trade names, produced by Shell Chemical Co.), DER 331-J, 337-J, 661-J, 664-J, 667-J (produced by Dow Chemical Co.) and Epictone 800 (trade name, produced by Dainippon Ink Kagaku Kogyo K. K.), etc. The novolac type epoxy resin may be, for example, Epicoat 152, 154, 172 (trade names, produced by Shell Chemical Co.), Allaldite EPN 1138 (trade name, produced by Ciba Geigy Co.), DER 431, 438 and 439 (trade names, produced by Dow Chemical Co.), etc. The alicyclic epoxy resin may be, for example, Araldite CY-175, -176, -179, -182, -184, -192 (trade names, produced by Ciba Geigy Co.), Chissonox 090, 091, 092, 301, 313 (trade names, produced by Chisso K. K.), CYRACURE 6100, 6110, 6200 and ERL 4090, 4617, 2256, 5411 (trade names, produced by Union Carbide Co.), etc. The polyglycidyl ether of aliphatic polyhydric alcohol may be, for example, ethyleneglycol diglycidyl ether, polyethyleneglycol diglycidyl ether, propyleneglycol diglycidyl ether, polypropyleneglycol diglycidyl ether, neopentylglycol diglycidyl ether, 1,6-hexanediol diglycidyl ether, glycerine diglycidyl ether, trimethylolpropane triglycidyl ether, diglycidyl ether of hydrogenated bisphenol A, 2,2-dibromoneopentylglycol diglycidyl ether, etc.; the polyglycidyl ether derived from aromatic polyhydric alcohol may be, for example, diglycidyl ether of an addition product of bisphenol A added with 2 to 16 mols of alkyleneoxide, a diglycidyl ether of an addition product of bisphenol F added with 2 to 16 mols of alkyleneoxide, a diglycidyl ether of an addition product of bisphenol S added with 2 to 16 mols of alkyleneoxide.

While various unsaturated carboxylic acids can be used for half-esterification of the epoxy resin, it is preferable for imparting better curability with an activation energy to the resin composition of the present invention to use a monobasic unsaturated carboxylic acid having an acrylic or methacrylic vinyl group on at least one terminal end of the molecule and a carboxyl group on the other terminal end.

Typical examples of such unsaturated carboxylic acids may include acrylic acid and methacrylic acid, and it is also possible to use a monoester compound obtained by the reaction between a dicarboxylic acid and a (meth)acrylic acid ester having one hydroxyl group.

The above dicarboxylic acid may include phthalic acid, isophthalic acid, terephthalic acid, oxalic acid, malonic acid, succinic acid, glutaric acid, adipic acid, pimelic acid, suberic acid, azelaic acid, sebacic acid, isosebacic acid, tetrahydrophthalic acid and anhydrydes thereof.

The above (meth)acrylic acid ester having one hydroxyl group may include, 2-hydroxypropyl (meth)-acrylate, 3-chloro-2-hydroxypropyl (meth)acrylate, 4-hydroxybutyl (meth) acrylate, 3-hydroxybutyl (meth) acrylate, 5-hydroxypentyl (meth) acrylate and 6-hydroxyhexyl (meth) acrylate and the like.

Examples of the addition reaction catalyst which can be used for half-esterification reaction of epoxy resin include metal halides such as zinc chloride, lithium chloride or the like; sulfide compounds such as dimethyl sulfide, methylphenyl sulfide or the like; sulfoxide compounds such as dimethyl sulfoxide, methylethylsulfoxide or the like; tertiary amine compounds such as N,N-dimethylaniline, pyridine, triethylamine, benzyldimethylamine or the like, and their hydrochlorides or hydrobromides; quaternary ammonium salts such as tetramethylammonium chloride, trimethyldodecylbenzylammonium chloride, triethylbenzylammonium chloride or the like; sulfonic acid compounds such as p-toluene sulfonic acid; and mercaptan compounds such as ethylmercaptan, propylmercaptan or the like.

Further, examples of the polymerization inhibitor which can be used for half-esterification include hydroquinone, alkyl or aryl-substituted hydroquinone, tertiary butylcatechol, pyrogallol, naphthylamine, β-naphthol, cuprous chloride, 2,6-di-tert-butyl-p-cresol, phenothiazine, pyridine, N-nitrosodiphenylamine and nitrobenzene.

The solvent which can be used when carrying out half-esterification in the presence of a solvent may include toluene, xylene, methyl isobutyl ketone, methyl ethyl ketone, ethyl acetate, butyl acetate and isobutyl acetate, etc.

The amounts of the epoxy resin and the unsaturated carboxylic acid used during half-esterification may be suitably selected so that the ratio of the epoxy groups in the epoxy resin to the carboxyl groups in the unsaturated carboxylic acid may be preferably 1: 0.3 to 1: 0.7, more preferably 1: 0.45 to 1: 0.55.

If the rate of esterification of epoxy groups by unsaturated carboxylic acid in the half-esterified epoxy resin is higher than the above-mentioned range, the satisfactory chemical resistance and dimensional stability resulting from the epoxy resin cannot be effectively exploited in the resin composition of the present invention. On the other hand, if the rate of esterification is lower than the above range, the high resolving power and curing property in response to an active energy ray, resulting from (meth)acrylate ester groups cannot be effectively exhibited in the resin composition of the present invention.

As explained in the foregoing, the active energy ray curable resin composition of the present invention is provided with a curing property in response to an active energy ray resulting from the (meth)acrylate ester groups in the half-esterified epoxy resin which is contained as an essential component, and a thermo-curing property resulting from epoxy groups. Therefore, a cured film obtained, after curing the resin composition of the present invention by the irradiation of an active energy ray, by thermal curing for 10 minutes to 3 hours at a temperature at least equal to 80° C. is effectively given satisfactory chemical resistance and dimensional stability, resulting from the epoxy resin.

The resin composition of the present invention may further contain a monomer (iii) having ethylenic unsaturated bond(s). The monomer (iii) containing ethylenic unsaturation is employed, in cooperation with the aforementioned resin component (ii), to provide the resin composition of the present invention with a curing property in response to an active energy ray, and in particular with an excellent sensitivity to the active energy ray. For this purpose there can be employed various monomers curable by the irradiation of an active energy ray, the monomer being preferably provided with a boiling point at least equal to 100° C. under atmospheric pressure and preferably provided with at least two ethylenic unsaturated bonds.

Specific examples of such monomers having two or more ethylenically unsaturated bonds include (a) acrylic acid esters or methacrylic acid esters of polyfunctional epoxy resins having two or more epoxy groups in one molecule, (b) acrylic acid esters or methacrylic acid esters of alkyleneoxide addition products of polyhydric alcohols, (c) polyester acrylates having acrylic acid ester group at the terminal ends of the molecular chains of polyesters having molecular weights of 500 to 3000 comprising dibasic acid and dihydric alcohol, (d) the reaction products between polyisocyanates and acrylic acid monomers having hydroxyl groups. The above monomers (a)–(d) may be urethane-modified products having urethane bonds in the molecules.

Examples of the monomers belonging to (a) include acrylic acid or methacrylic acid esters of polyfunctional epoxy resins to be used for formation of the resin component (half-esterified epoxy resin) for the resin component (ii) which becomes one of the components in the resin composition of the present invention as described above.

Examples of the monomers belonging to (b) include ethyleneglycol di(meth)acrylate, diethyleneglycol (meth) acrylate, polyethyleneglycol di(meth)acrylate, 1,6-hexanediol (meth)acrylate, polyethyleneglycol di(meth) acrylate, pentaerythritol tri(meth)acrylate and the like, and those known under the trade names of KAYARAD HX-220, HX-620, D-310, D-320, D-330, DPHA, R-604, DPCA-20, DPCA-30, DPCA-60, DPCA-120 (all produced by Nippon Kayaku K. K.), and also those known under the trade names of NK ester BPE-200, BPE-500, BPE-1300, A-BPE-4 (all produced by Shin Nakamura Kagaku K. K.), etc., may also be available.

The monomers belonging to (c) may be exemplified by those known under the trade names of Aronix M-6100, M-6200, M-6250, M-6300, M-6400, M-7100, M-8030, M-8060, M-8100 (all produced by Toa Gosei Kagaku K. K.). Examples of the monomers belonging to ⓑ and having urethane bonds of polyester include those known under the trade names of Aronix M-1100, Aronix M-1200, (both produced by Toa Gosei Kagaku K. K.).

The monomers belonging to ⓓ may include the reaction products between polyisocyanate such as tolylene diisocyanate, isophorone diisocyanate, hexamethylene diisocyanate, trimethylhexamethylene diisocyanate, lysine diisocyanate, diphenylmethane diisocyanate or the like with a hydroxyl containing acrylic monomer, and it is possible to use the reaction products having (meth)-acrylic acid esters containing hydroxyl group(s) added to polyisocyanate compounds known under the trade names of Sumidule N (buret derivative of hexamethylene diisocyanate), Sumidule L (trimethylolpropane modified product of tolylene diisocyanate) (all produced by Sumitomo Bayer Urethane K. K.), etc. The hydroxyl containing acrylic monomer as herein mentioned may include typically (meth) acrylic acid esters, preferably hydroxyethyl acrylate, hydroxyethyl methacrylate, hydroxypropyl acrylate. It is also possible to use other acrylic monomers containing hydroxyl group(s) mentioned in the present specification as monomer for the preparation of the linear polymer.

In addition to the monomers having two or more ethylenically unsaturated bonds as mentioned above, it is also possible to use monomers having only one ethylenically unsaturated bond as mentioned below together with these monomers. To exemplify such monomers having one ethylenically unsaturated bond, there may be included, for example, carboxyl containing unsaturated monomers such as acrylic acid, methacrylic acid or the like; glycidyl containing unsaturated monomers such as glycidyl acrylate, glycidyl methacrylate or the like; $C_2$–$C_8$ hydroxyalkyl esters of acrylic acid or methacrylic acid such as hydroxyethyl acrylate, hydroxyethyl methacrylate, hydroxypropyl acrylate, hydroxypropyl methacrylate or the like; monoesters of acrylic acid or methacrylic acid with polyethyleneglycol or polypropyleneglycol such as polyethyleneglycol monoacrylate, polyethyleneglycol monomethacrylate, polypropyleneglycol monoacrylate, polypropyleneglycol monomethacrylate or the like; $C_1$–$C12$ alkyl or cycloalkyl esters of acrylic acid or methacrylic acid such as methyl acrylate, ethyl acrylate, propyl acrylate, isopropyl acrylate, butyl acrylate, hexyl acrylate, octyl acrylate, lauryl acrylate, cyclohexyl acrylate, methyl methacrylate, ethyl methacrylate, propyl methacrylate, isopropyl methacrylate, butyl methacrylate, hexyl methacrylate, octyl methacrylate, lauryl methacrylate, cyclohexyl methacrylate or the like; other monomers such as styrene, vinyltoluene, methylstyrene, vinyl acetate, vinyl chloride, vinyl isobutyl ether, acrylonitrile, acrylamide, methacrylamide, acrylic acid or methacrylic acid adduct of alkylglycidyl ether, vinylpyrrolidone, dicyclopentenyloxyethyl(meth)acrylate, ε-caploractone-modified hydroxyalkyl(meth)acrylate, tetrahydrofurfulyl acrylate, phenoxyethyl acrylate; and others.

Anyway, by further adding the above monomer having ethylenically unsaturated bonds (iii), high sensitivity and satisfactory curability to an active energy ray can be further imparted to the composition of the present invention.

The active energy ray to be used for curing of the active energy ray-curable resin composition of the present invention may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm$^2$ to 100 mW/cm$^2$ at the wavelength in the vicinity of 365 nm at a distance between the lamp and the material to be irradiated which is practically permissible. The electron beam irradiation device is not particularly limited, but a device having a dose within the range of 0.5 to 20M Rad is practically suitable.

The active energy ray-curable resin composition of the present invention can be cured by the active energy ray as described above, and it is preferable to add thereto a radical polymerization initiator capable of forming organic free radicals which can be activated by the action of an active energy ray in the resin composition when employing an active energy ray with wavelength of 250 nm to 450 nm. As the radical polymerization initiator, known substances having the property of being activated with an active energy ray, forming organic free radicals and initiating radical polymerization can be used without any particular limitation.

Specific examples of such radical polymerization initiators include benzil, benzoin alkyl ethers such as benzoin isobutyl ether, benzoin isopropyl ether, benzoin-n-butyl ether, benzoin ethyl ether, benzoin methyl ether and the like; benzophenones such as benzophenone, 4,4'-bis(N,N-diethylamino)benzophenone, benzophenone methyl ether and the like; anthraquinones such as 2-ethylanthraquinone, 2-t-butylanthraquinone and the like; xanthones such as 2,4-dimethylthioxanthone, 2,4-diisopropylthioxanthone and the like; acetophenones such as 2,2-dimethoxy-2-phenylacetophenone, α,α-dichloro-4-phenoxyacetophenone, p-tert-butyltrichloroacetophenone, p-tert-butyl-dichloroacetophenone, 2,2-diethoxyacetophenone, p-dimethylaminoacetophenone and the like; or hydroxycyclohexylphenyl ketone (e.g., Irgacure 184, produced by Ciba Geigy Co.), 1-(4-isopropylphenyl)-2-hydroxy-2-methylpropane-1-one (e.g. Darocure 1116, produced by MERCK Co.), 2-hydroxy-2-methyl-1-phenylpropane-1-one (Darocure 1173, produced by MERCK CO.); etc., as preferable ones. In addition to these radical polymerization initiators, amino compounds may be added as the photopolymerization accelerator.

The amino compounds to be used as the photopolymerization accelerator may include ethanolamine, ethyl-4-dimethylaminobenzoate, 2-(dimethylamino)-ethylbenzoate, p-dimethylaminobenzoic acid n-amylester, p-dimethylaminobenzoic acid isoamylester, etc.

Further, in the active energy ray-curable resin composition of the present invention, in order that the epoxy groups possessed by the half-esterified epoxy resin (ii) can be also photopolymerized by the action of the active energy ray, there can be formulated aromatic onium salt compounds having photosensitivity containing an element belonging to Group VIa as shown in Japanese Patent Publication No. 52-14278 or aromatic onium salt compounds having photosensitivity containing an element belonging to Group Va as shown in Japanese Patent Publication No. 52-14279.

The aromatic onium salt compounds having photosensitivity of the element belonging to the group VIa or Group Va may include typically the compounds of the following formula IV:

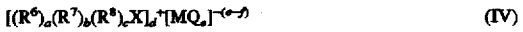

(wherein R$^6$ is a monovalent organic aromatic group, R$^7$ is a monovalent organic aliphatic group selected from alkyl groups, dicycloalkyl groups and substituted alkyl groups, R$^8$ is a polyvalent organic group for constituting heterocyclic or fused ring structures selected from aliphatic groups and aromatic groups, X is an element belonging to Group VIa selected from sulfur, selenium and tellurium or an element belonging to Group Va selected from nitrogen, phosphorus, arsenic, antimony and bismuth, M is a metal or metalloid and Q is a halogen atom, a is an integer of 0 to 3 when X is an element belonging to Group VIa or an integer of 0 to 4 when X is an element belonging to Group Va, b is an integer of 0 to 2, c is an integer of 0 or 1 when X is an element belonging to Group VIa or an integer of 0 to 2 when X is an element belonging to Group Va, f is an integer of 2 to 7 representing the valence of M, e is an integer which is greater than f but not more than 8, and the sum of a, b and c is 3 (valence of X) when X is an element belonging to Group VIa or 4 (valence of X) when X is an element belonging to Group Va, and d=e−f). These compounds have the characteristic that the onium salt will release a Lewis acid by irradiation of light on these compounds, which acid cures the epoxy resin.

Specific examples of the photosensitive aromatic onium salt compounds containing an element belonging to Group VIa or Group Va which can be formulated in the resin composition of the present invention may include the photosensitive aromatic onium salts of the elements belonging to Group VIa as shown below:

a)

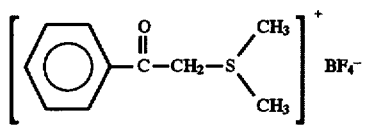

b)

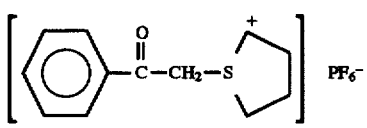

c)

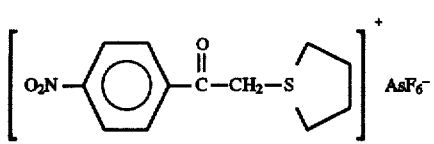

d)

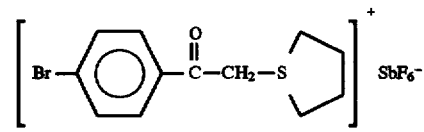

e)

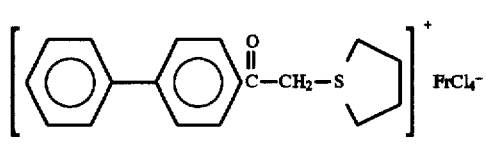

f)

g)

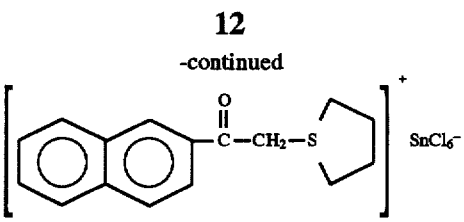

h)

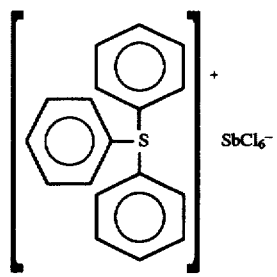

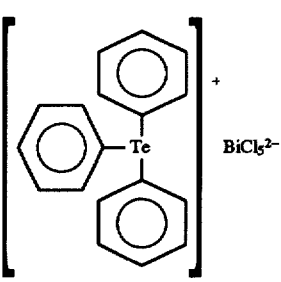

i)

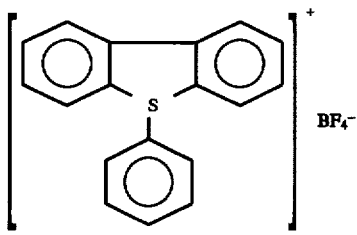

j)

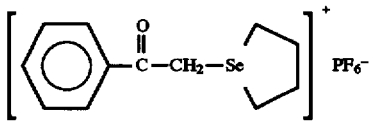

and photosensitive aromatic onium salts of the elements belonging to Group VIa as shown below:

1)

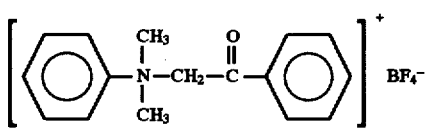

2)

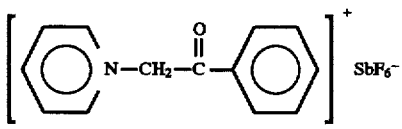

3)

4)

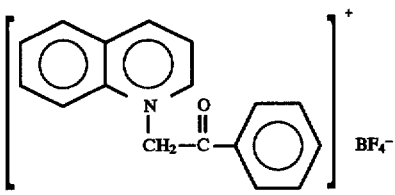

5)

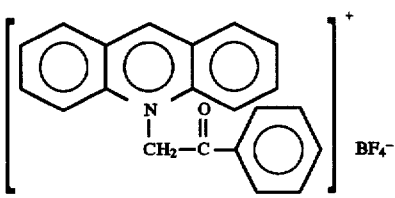

6)

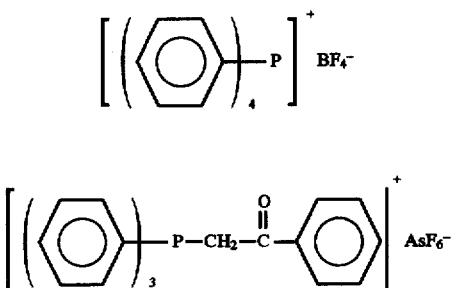

7)

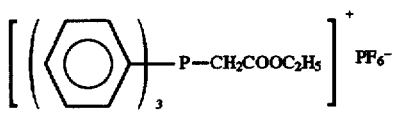

8)

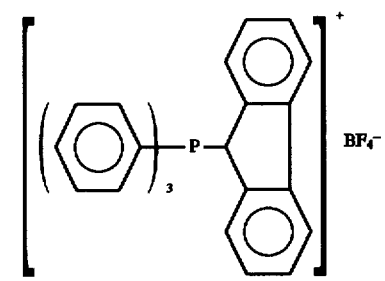

9)

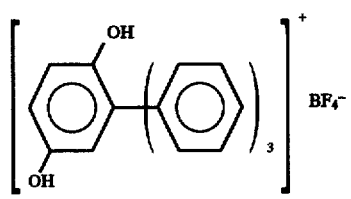

10)

11)

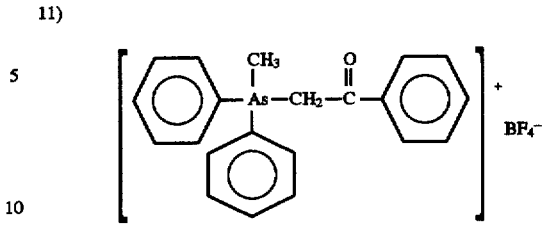

12)

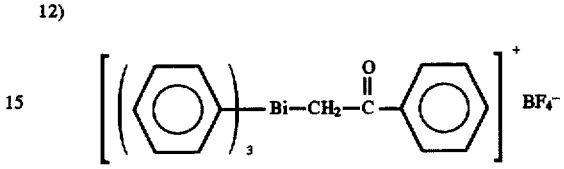

As regards the ratio of the aforementioned materials constituting the active energy ray curable resin composition of the present invention, the linear polymer (i) occupies 20 to 80 parts by weight, preferably 20 to 50 parts by weight, while the half-esterified epoxy resin (ii), optionally combined with the monomer (iii) having ethylenic unsaturated bond, occupies 80 to 20 parts by weight, preferably 80 to 50 parts by weight, so that the components (i)+(ii) or (i)+(ii)+(iii) represent 100 parts by weight. In the presence of the monomer (iii) having ethylenic unsaturated bond, the amounts of the monomer (iii) and the half-esterified epoxy resin (ii) are preferably selected in such a manner that the ratio thereof in the resin composition is in a range from 30:70 to 70:30, in order to fully exploit the characteristics of these components.

More specifically, the half-esterified epoxy resin (ii) is effective for rendering the physical properties such as adhesion to the substrate, chemical resistance and dimensional stability of the cured film close to those of the cured film of epoxy resin, while the monomer (iii) having ethylenic unsaturated bond is effective for providing the resin composition with a high sensitivity to the activating energy, and it is possible to obtain an excellent resin composition and an excellent cured film based on the composition, provided with the properties of both components, if the ratio of the components (ii) and (iii) is in the above-mentioned range.

In case a radical polymerization initiator to be activated by an active energy ray is included in the resin composition of the present invention, the polymerization initiator is added in an amount of 0.1 to 20 parts by weight, preferably 1 to 10 parts by weight, to 100 parts by weight of the resin 10 components, consisting of the linear polymer, half-esterified epoxy resin and optionally monomer containing ethylenic unsaturated bond [(i)+(ii) or (i)+(ii)+(iii)].

Also in the case of using of the photosensitive aromatic onium salts containing an element of the group VIa or Va of the periodic table, said compound is included in an amount of 0.2 to 15 parts by weight, preferably 0.5 to 10 parts by weight, with respect to 100 parts by weight of the resin components consisting of the linear polymer, half-esterified epoxy resin and optionally monomer containing ethylenic unsaturated bond [(i)+(ii) or (i)+(ii)+(iii)].

As the solvent to be used when employing the active energy ray-curing resin composition of the present invention in the form of a solution or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the composition of the present invention.

The active energy ray-curing resin composition of the present invention may further contain in addition to the above radical polymerization initiator or the solvent as described above, additives such as catalysts for condensation crosslinking, heat polymerization inhibitors, colorants (dyes and pigments), fine particulate fillers, adhesion promotors, plasticizers, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant there can be added oil-soluble dyes and pigments within the range which do not substantially prevent transmission of the active energy ray. As the filler, for enhancement of coating hardness, as well as for enhancement of coloration, adhesion, and mechanical strength, there may be employed extender pigments, plastic fine particles, etc., which are used in coating materials in general. As the adhesion promotor, silane coupling agents, and low molecular surfactants as inorganic surface modifiers may be effectively used in the composition of the present invention.

Also, in the active energy ray-curing resin composition of the present invention, curing agents for epoxy resins may be added, if desired. The curing agent for epoxy resin which can be added in the resin composition of the present invention may include, for example, polyamines, polyamides, acid anhydrides, boron trifluoride-amine complex, dicyandiamide, imidazoles, complexes of imidazole and metal salts.

The active energy ray-curing resin composition of the present invention can be used for protective coating of glass, adhesive, insulating layer of liquid crystal display devices, or surface modification such as transparent coloration or opaque coloration on glass plate, imparting of waterproofness, water repellency, anti-stain property, etc. Also, by making available excellent chemical resistance, it is useful as the masking material for glass etching or metallizing such as electroless copper plating, etc., solder mask for printed wiring board, etc. It is also useful for formation of minute liquid pathways, cooling pathways or nozzles utilizing water resistance, particularly for formation of nozzles in inkjet recording heads. Further, it is possible to obtain a photosensitive liquid or dry film for screen process printing which can be used for both aqueous and oily inks having high durability incomparable with other materials.

When the active energy ray-curing resin composition of the present invention is provided for various uses as mentioned above, it can be used according to the methods as exemplified below.

1) The composition of the present invention is applied on a substrate to a desired thickness within the range from 1 to 100 μm, the solvent is dried by evaporation and then an active energy ray is irradiated. Then, the substrate is heated at 80° C. or higher for about 10 minutes to 3 hours. When a heat curable linear polymer is employed, the heat treatment temperature is made at least 100° C. and the treatment is carried out for about 5 to 60 minutes.

2) The composition of the present invention is applied on a substrate to a desired thickness of 1 to 100 μm, followed by drying by evaporation of the solvent. Subsequently, a mask pattern with a transmittance of the active energy ray of at least 1% or less is closely in contacted on the composition, and an active energy ray is irradiated from above the mask. Then, development is effected with a developer capable of dissolving the composition to remove the non-irradiated portion. Then, the substrate is heated at a temperature of at least 80° C. for about 10 minutes to 3 hours. When a heat curable linear polymer is used, the treatment temperature is made at least 100° C. and treatment is carried out for about 5 to 60 minutes.

The cured film obtained as described above is excellent in resolution as a matter of course, and also in adhesion to the substrate, mechanical strength, water resistance, chemical resistance and dimensional stability.

The active energy ray curable resin composition of the present invention can be also formed into a dry film, which is adhered on a substrate and then exposure and heating treatment are applied as described above whereby a cured film of the resin composition or a pattern comprising the cured film can be obtained on the substrate. Also in this case, it is possible to obtain a cured film excellent in adhesion to the substrate, mechanical strength, water resistance, chemical resistance and dimensional stability.

As explained in the foregoing, the active energy ray curable resin composition of the present invention has excellent sensitivity and resolving power as a pattern forming material, and is capable of forming a pattern with a high density and a high resolving power.

The properties of the resin composition of the present invention are effectively derived from those of the linear polymer and the half-esterified epoxy resin, which are contained as essential components in the resin composition. More specifically the resin composition of the present invention is featured by excellent adhesion to the substrate and high mechanical strength which are principally attributable to the linear polymer, and by excellent chemical resistance and dimensional stability which are principally attributable to the half-esterified epoxy resin. Thus the pattern formed by the resin composition has these excellent characteristics as a coating material, and is suitable as a protective coating or a structural material requiring a prolonged service life.

Also the use of a curable linear polymer in the resin composition allows further improvement in the adhesion, mechanical strength and chemical resistance.

In the following the present invention will be further clarified by examples thereof.

EXAMPLE 1

Methyl methacrylate, t-butyl methacrylate and dimethylaminoethyl methacrylate, mixed in a molar ratio of 70/20/10, were subjected to solution polymerization in toluene to obtain a linear polymer of a weight-average molecular weight of $7.8 \times 10^4$ and a glass transition point of 89° C., which will be herein-after referred to as LP-1.

Separately a mixture of 200 gr. of a bisphenol-A type epoxy resin Epicron 855, having an epoxy equivalent of 183–193 and produced by Dai-Nippon Ink Chemical Industries Co., 4 gr. or triethylbenzyl ammonium chloride as catalyst, and 0.5 gr. of hydroquinone as thermal polymerization inhibitor was heated to 80° C., and acrylic acid was dropwise added in an amount of 0.5 equivalents per 1 equivalent of epoxy radicals present in the mixture. After the addition of acrylic acid, the mixture was further agitated for 4 hours to complete the reaction. In this manner there was obtained a half-esterified epoxy resin, in which the epoxy radicals were partly esterified by acrylic acid. Said half-esterified epoxy resin will hereinafter be referred to as HE-1.

The linear polymer LP-1 and the epoxy half ester HE-1, obtained as explained above, were employed in the preparation of an active energy ray curable resin composition indicated below, wherein the amounts are indicated by parts by weight:

| | |
|---|---|
| 100 | LP-1 |
| 120 | HE-1 |
| 10 | Irgacure 651 |
| 0.5 | Crystal violet |
| 0.5 | t-butylhydroquinone |
| 300 | MIBK/toluene mixture (1:1) |

Said composition was coated, with a bar coater, on a Pyrex substrate of 10×10 cm, which was subjected to ultrasonic washing in washing liquid Daifron (Daikin Kogyo Co., Ltd.) and dried, so as to obtain a thickness of ca. 50 μm after drying.

A polyethylene terephthalate film Lumilar T of a thickness of 16 μm was laminated on said composition, and the composition was then exposed for 60 seconds, through a resolution test mask, to the light of a semiconductor mask aligner MA-10 (Mikasa Co., Ltd.) utilizing an ultra-high pressure mercury lamp with a central wavelength of ca. 365 nm and with a light energy of 12 mW/cm$^2$ at the irradiated surface. After the exposure, development was conducted for 45 seconds in the ultrasonic washer with liquid developer composed of 1,1,1-trichloroethane and ethanol with a mixing ratio of 80/20. After said development, the resin composition precisely reproduced a line/space pattern of a width of 50 μm.

Subsequently the substrate was dried by heating, subjected to a post-exposure of 10 J/cm$^2$, and heated for 30 minutes at 150° C. A cross-cut tape peeling test with an industrial cellophane tape, conducted on said substrate, showed adhesion of 100/100. The adhesion of the pattern was complete except for the evident scar caused by cross cutting.

Then the substrate was boiled for 4 hours in NaOH aqueous solution of pH=9.0, and again subjected to a cross-cut tape peeling test and a peeling test of a pattern portion of 50 μm. In either test there was observed no deterioration in adhesion, such as peeling or film separation from the substrate. Also there was observed no change in the film quality, such as whitening.

EXAMPLE 2

Methyl methacrylate, butylcarbamylethyl methacrylate and butoxymethyl acrylamide, mixed in a molar ratio of 80/10/10, were subjected to solution polymerization in toluene to obtain thermo-crosslinkable linear polymer with a weight-average molecular weight of 1.4×10$^5$ and a glass transition point of 75° C., which will be referred to as LP-2.

Separately an epoxy half ester HE-2 was prepared in the same manner as in Example 1, except that there was employed a bisphenol-A type epoxy resin Epicron 1050 (Dai-Nippon Ink Chemical Industries Co., Ltd.) of an epoxy equivalent of 450–500, at a ratio of 0.5 equivalents of acrylic acid to 1 equivalent of epoxy radicals.

Also an epoxy half ester HE-3 was prepared in the same manner as in Example 1, except that there was employed an alicyclic type epoxy resin Celloxide 2021 (Daicel Co., Ltd.) with an epoxy equivalents of 128–145, at a ratio of 0.5 equivalent of acrylic acid to equivalent of epoxy radicals.

The thermo-crosslinkable linear polymer LP-2, and the epoxy half esters HE-2, HE-3 obtained in the above-explained manner and the epoxy half ester HE-1 obtained in Example 1 were employed in the preparation of an active energy ray curable resin composition in the following manner, wherein the amounts are represented by parts by weight;

| | |
|---|---|
| 100 | LP-2 |
| 50 | HE-1 |
| 50 | HE-2 |
| 20 | HE-3 |
| 10 | Irgacure 651 |
| 3 | Paratoluene sulfonic acid |
| 0.5 | Crystal violet |
| 0.5 | t-butylhydroquinone |
| 300 | MIBK/toluene mixture (1:1) |

The above-explained resin composition was employed in the preparation of a pattern in the same manner as in Example 1.

The obtained pattern was clear, with a resolving power of 50 μm.

Then the specimen was subjected to post-exposure and heating in the same manner as in Example 1. A cross-cut tape peeling test showed complete adhesion of 100/100, except for evident scars caused by cross-cutting.

The substrate was boiled for 8 hours in NaOH aqueous solution of pH=9.0, and was subjected again to a cross-cut tape peeling test and a peeling test of a pattern portion of 50 μm. In either test there was not observed any deterioration in adhesion such as peeling or film separation from the substrate. Also there was not observed any change in the film, such as whitening.

EXAMPLE 3

Methyl methacrylate, acrylic acid and 2-hydroxyethyl methacrylate, mixed in a molar ratio of 70/10/20, were subjected to solution polymerization in toluene to obtain a copolymer. Then 1 equivalent of glycidyl methacrylate per 1 equivalent of carboxyl radicals present in said copolymer was added, and reaction was conducted in the presence of triethyl-benzyl ammonium chloride as catalyst and at 80° C. to obtain photo-crosslinkable linear polymer LP-3 with a weight-average molecular weight of 1.1×10$^5$ and a glass transition point of 96° C.

Separately an epoxy half ester HE-4 was prepared in the same manner as in Example 1, except that there was employed a cresol-novolak type epoxy resin Epicron N-685 (Dai-Nippon Ink Chemical Industries Co., Ltd.) with an epoxy equivalent of 220–230, at a ratio of 0.5 equivalents of acrylic acid to 1 equivalent of epoxy radicals.

The photo-crosslinkable linear polymer LP-3 and the epoxy half-ester HE-4, both obtained as explained above, and the epoxy half-esters HE-1, HE-3 obtained in Examples 1, 2 were employed to prepare an active energy ray curable resin composition in the following manner, wherein the amounts are represented in parts by weight:

| | |
|---|---|
| 100 | LP-3 |
| 50 | HE-1 |

| | |
|---|---|
| 20 | HE-3 |
| 50 | HE-4 |
| 10 | Irgacure 651 |
| 7.0 | 2-ethyl-4-methylimidazole |
| 0.5 | Crystal violet |
| 0.5 | t-butylhydroquinone |
| 300 | MIBK/toluene mixture (1:1) |

Said resin composition was coated, with a bar coater, onto a silicon wafer bearing an SiO$_2$ oxide layer on the surface, in such a manner as to obtain a thickness of ca. 50 μm after drying. Then a resolution test pattern was formed in the same manner as in Example 1. The formed pattern precisely reproduced a line/space pattern of a width of 50 μm.

Subsequently said silicon wafer was dried by heating, and subjected to a post-exposure of 10 J/cm$^2$ with the same UV light source as employed in the pattern exposure. A cross-cut tape peeling test, conducted on said silicon wafer, did not reveal any peeling.

Then the substrate was boiled for 8 hours in NaOH aqueous solution of pH=9.0, and subjected again to a cross-cut tape peeling test and a peeling test of a pattern portion of 50 μm. In either test there could not be observed any deterioration in the adhesion such as peeling or film separation from the substrate. Also there was not observed any change in the quality of film, such as whitening.

EXAMPLE 4

An epoxy half ester HE-5 was prepared in the same manner as in Example 1, except that there was employed a cresol-novolak type epoxy resin Epicron N-680 (Dai-Nippon Ink Chemical Industries Co., Ltd.) with an epoxy equivalent of 205–250, at a ratio of 0.5 equivalent of acrylic acid to 1 equivalent of epoxy radicals.

The thermo-crosslinkable linear polymer LP-2, the epoxy half esters HE-1, HE-3 obtained in Examples 1–3 and the above-mentioned HE-5 were employed to prepare an active energy ray curable resin composition in the following manner, wherein the amounts are represented in parts by weight:

| | |
|---|---|
| 100 | LP-2 |
| 50 | HE-1 |
| 20 | HE-3 |
| 50 | HE-5 |
| 10 | Irgacure 651 |
| 0.5 | Copper phthalocyanine |
| 0.5 | t-butylhydroquinone |
| 300 | MIBK/toluene mixture (1:1) |

1% ethanolic solution of γ-mercaptopropyl-trimethoxysilane, which is a silane coupling agent containing thiol radicals, was coated on a Pyrex glass plate of 10×10 cm by means of rotation with a spinner for 25 seconds at 2500 rpm. Then said glass plate was heat treated for 10 minutes at 120° C. Separately mill dispersion of the above-mentioned resin composition was coated with a wire bar on a polyethylene terephthalate film of a thickness of 16 μm, and dried for 20 minutes at 100° C. to obtain a resin composition layer of a thickness of 50 μm. Subsequently the film was laminated on the Pyrax glass plate, by means of a laminator known under the trade name HRL-24 produced by DuPont, at 120° C. and at a peripheral speed of 1 m/min. Then a blue-colored clear pattern with lines and spaces of each 50 μm wide was be formed in the same manner as in Example 1.

Subsequently a post-exposure of 10 J/cm$^2$ and a heat treatment for 15 minutes at 150° C. were conducted to complete the curing. A cross-cut tape peeling test showed complete adhesion of 100/100, except for evident scars caused by cross-cutting.

Also said substrate was boiled for 8 hours in NaOH aqueous solution of pH=9.0. After boiling, the substrate was again subjected to a cross-cut tape peeling test and a peeling test of a pattern portion of 50 μm wide. In either test there could not be observed any deterioration in adhesion, such as peeling or film separation from the substrate. Also there could be observed no change in the film quality, such as whitening.

EXAMPLE 5

An epoxy half ester (HE-6) was prepared in the same manner as in Example 1, except that there was employed a phenol-novolak type epoxy resin Epicron N-730 (Dai-Nippon Ink Chemical Industries Co., Ltd.) with an epoxy equivalent of 170–190, at a ratio of 0.5 equivalent of acrylic acid to 1 equivalent of the epoxy radicals.

The photo-crosslinkable linear polymer LP-3 and the epoxy half esters HE-1, HE-3 obtained in Examples 1–3, and the above-mentioned epoxy half ester HE-6 were employed in preparing an active energy ray curable resin composition in the following manner, wherein the amounts are represented in parts by weight:

| | |
|---|---|
| 100 | LP-3 |
| 50 | HE-1 |
| 20 | HE-3 |
| 50 | HE-6 |
| 10 | Irgacure 651 |
| 7.0 | Triphenylsulfonium tetrafluoroborate |
| 0.5 | Crystal violet |
| 0.5 | t-butylhydroquinone |
| 300 | MIBK/toluene mixture (1:1) |

The above-explained resin composition was employed in the preparation of a pattern in the same manner as in Example 1.

The obtained pattern was clear, with a resolving power of 50 μm.

The substrate was subjected to post-exposure and heating in the same manner as in Example 1. A cross-cut tape peeling test showed complete adhesion of 100/100, except for evident scars caused by cross-cutting.

The substrate was boiled for 8 hours in NaOH aqueous solution of pH=9.0, and was subjected again to a cross-cut tape peeling test and a peeling test of a pattern portion of 50 μm. In either test there was not observed any deterioration in adhesion such as peeling or film separation from the substrate. Also there was not observed any change in the film, such as whitening.

EXAMPLE 6

Methyl methacrylate, tetrahydrofurfuryl acrylate and n-butyl acrylate, mixed with a molecular ratio of 50/30/20, were subjected to solution polymerization in toluene to obtain linear polymer LP-4 of a weight-average molecular weight of 8.0×10$^4$ and a glass transition point of 55° C.

The epoxy half esters HE-3, HE-4 obtained in Examples 1–3 and the above-mentioned linear polymer LP-4 were employed in preparing an active energy ray curable resin composition in the following manner, wherein the amounts are represented in parts by weight:

| | |
|---|---|
| 100 | LP-4 |
| 20 | HE-3 |
| 100 | HE-4 |
| 8 | 2-ethyl-4-methylimidazole |
| 10 | Irgacure 651 |
| 0.5 | Crystal violet |
| 0.5 | t-butylhydroquinone |
| 300 | MIBK/toluene mixture (1:1) |

The above-explained resin composition was employed in the preparation of a pattern in the same manner as in Example 1.

The obtained pattern was clear, with a resolving power of 50 μm.

Then the substrate was subjected to post-exposure and heating in the same manner as in Example 1. A cross-cut tape peeling test showed complete adhesion of 100/100, except for evident scars caused by cross-cutting.

Then the substrate was boiled for 4 hours in NaOH aqueous solution of pH=9.0, and was subjected again to a cross-cut tape peeling test and a peeling test of a pattern portion of 50 μm. In either test there was not observed any deterioration in adhesion such as peeling or film separation from the substrate. Also there was not observed any change in the film, such as whitening.

EXAMPLE 7

The linear polymer LP-4 obtained in Example 6, the epoxy half ester HE-3 obtained in Example 2 and the HE-5 obtained in Example 4 were employed in preparing an active energy ray curable resin composition in the following manner, wherein the amounts are represented by parts by weight:

| | |
|---|---|
| 100 | LP-4 |
| 20 | HE-3 |
| 100 | HE-5 |
| 8 | 2-ethyl-4-methylimidazole |
| 10 | Irgacure 651 |
| 0.5 | Crystal violet |
| 0.5 | t-butylhydroquinone |
| 300 | MIBK/toluene mixture (1:1) |

The above-explained resin composition was employed in the preparation of a pattern in the same manner as in Example 1.

The obtained pattern was clear, with a resolving power of 50 μm.

Then the substrate was subjected to post-exposure and heating in the same manner as in Example 1. A cross-cut tape peeling test showed complete adhesion of 100/100, except for evident scars caused by cross-cutting.

Also the substrate was boiled for 4 hours in NaOH aqueous solution of pH=9.0, and was subjected again to a cross-cut tape peeling test and a peeling test of a pattern portion of 50 μm. In either test there was not observed any deterioration in adhesion such as peeling or film separation from the substrate. Also there was not observed any change in the film, such as whitening.

EXAMPLE 8

The linear polymer LP-4 obtained in Example 6, the epoxy half ester HE-3 obtained in Example 2 and the epoxy half ester HE-6 obtained in Example 5 were employed in preparing an active energy ray curable resin composition in the following manner, wherein the amounts are represented by parts by weight:

| | |
|---|---|
| 100 | LP-4 |
| 20 | HE-3 |
| 100 | HE-6 |
| 8 | 2-ethyl-4-methylimidazole |
| 10 | Irgacure 651 |
| 0.5 | Crystal violet |
| 0.5 | t-butylhydroquinone |
| 300 | MIBK/toluene mixture (1:1) |

The above-explained resin composition was employed in the preparation of a pattern in the same manner as in Example 1.

The obtained pattern was clear, with a resolving power of 50 μm.

Then the substrate was subjected to post-exposure and heating in the same manner as in Example 1. A cross-cut tape peeling test showed complete adhesion of 100/100, except for evident scars caused by cross-cutting.

Also the substrate was boiled for 4 hours in NaOH aqueous solution of pH=9.0, and was subjected again to a cross-cut tape peeling test and a peeling test of a pattern portion of 50 μm. In either test there was not observed any deterioration in adhesion such as peeling or film separation from the substrate. Also there was not observed any change in the film, such as whitening.

REFERENCE EXAMPLE 1

The linear polymer LP-1 obtained in Example 1 was employed in preparing an active energy ray curable resin composition in the following manner, wherein the amounts are represented by parts by weight:

| | |
|---|---|
| 100 | LP-1 |
| 60 | Trimethylolpropane triacrylate |
| 60 | Epicron 855 |
| 10 | Irgacure 651 |
| 8 | 2-ethyl-4-methylimidazole |
| 0.5 | Crystal violet |
| 0.5 | t-butylhydroquinone |
| 300 | MIBK/toluene mixture (1:1) |

The above-explained resin composition was employed in the preparation of a pattern in the same manner as in Example 1.

The obtained pattern image was blurred, with a resolving power of 200 μm. Narrower lines were dissolved and eliminated at the development step.

Then the specimen was subjected to post-exposure and heating in the same manner as in Example 1. A cross-cut tape peeling test shows satisfactory adhesion of 100/100.

Also said substrate was boiled for 4 hours in NaOH aqueous solution of pH=9.0, and was subjected again to a cross-cut tape peeling test. The adhesion was unsatisfactorily as low as 10/100.

REFERENCE EXAMPLE 2

The linear polymer LP-1 obtained in Example 1 was employed in preparing an active energy ray curable resin composition in the following manner, wherein the amounts are represented by parts by weight:

| | |
|---|---|
| 100 | LP-1 |
| 120 | UE-8200 (acrylate ester of Epicron 855 produced by Dai-Nippon Ink Chemical Industries Co., Ltd.) |
| 10 | Irgacure 651 |
| 0.5 | Crystal violet |
| 0.5 | t-butylhydroquinone |
| 300 | MIBK/toluene mixture (1:1) |

The above-explained resin composition was employed in the preparation of a pattern in the same manner as in Example 1.

The obtained pattern was clear, with a resolving power of 50 μm.

The specimen was then subjected to post-exposure and heating in the same manner as in Example 1. A cross-cut tape peeling test revealed unsatisfactory adhesion of 10/100.

Also the substrate was boiled for 4 hours in NaOH aqueous solution of pH=9.0. The pattern was already peeled off at the end of the boiling.

As will be apparent from the foregoing Examples and Reference Examples, the active energy ray curable resin composition of the present invention is not only capable of forming a pattern with a high resolving power but also provides strong adhesion to the substrate and excellent mechanical strength and chemical resistance.

EXAMPLE 9

The aforementioned linear polymer LP-1 and the aforementioned epoxy half ester HE-1 were employed in the preparation of an active energy ray curable resin composition in the following manner, wherein the amounts are represented by parts by weight:

| | |
|---|---|
| 100 | LP-1 |
| 80 | HE-1 |
| 120 | Aronix M8060 (polyester acrylate produced by Toa Gosei Kagaku Co., Ltd.) |
| 10 | Irgacure 651 |
| 0.5 | Crystal violet |
| 0.5 | t-butylhydroquinone |
| 300 | MIBK/toluene mixture (1:1) |

Said composition was coated, with a bar coater, on a Pyrex glass substrate of 10×10 cm, which was subjected to ultrasonic washing in washing liquid Daifron (Daikin Kogyo Co., Ltd.) and dried, so as to obtain a thickness of ca. 50 μm after drying.

A polyethylene terephthalate film Lumilar T of a thickness of 16 μm was laminated on said composition, and the composition was then exposed for 60 seconds, through a resolution test mask, to the light of a semiconductor mask aligner MA-10 (Mikasa Co., Ltd.) utilizing an ultra-high pressure mercury lamp with a central wavelength of ca. 365 nm and with a light energy of 12 mW/cm$^2$ at the irradiated surface. After the exposure, development was conducted for 45 seconds in the ultrasonic washer with liquid developer composed of 1,1,1-trichloroethane. After development, the resin composition precisely reproduced a line/space pattern of a width of 50 μm.

Subsequently the substrate was dried by heating, subjected to a post-exposure of 10 J/cm$^2$, and heated for 30 minutes at 150° C. A cross-cut tape peeling test with an industrial cellophane tape, conducted on said substrate, showed adhesion of 100/100. The adhesion of the pattern was complete except for evident scars caused by cross-cutting.

Then the substrate was boiled for 4 hours in NaOH aqueous solution of pH=9.0, and again subjected to a cross-cut tape peeling test and a peeling test of a pattern portion of 50 μm. In either test there was not observed any deterioration in adhesion, such as peeling or film separation from the substrate. Also there was not observed any change in the film quality, such as whitening.

EXAMPLE 10

The thermo-crosslinkable linear polymer LP-2 and the epoxy half esters HE-2, HE-3 were employed in preparing an active energy ray curable resin composition in the following manner, wherein the amounts are represented by parts by weight:

| | |
|---|---|
| 100 | LP-2 |
| 50 | Aronix M-8060 |
| 50 | HE-2 |
| 20 | HE-3 |
| 10 | Irgacure |
| 3 | Paratoluene sulfonic acid |
| 0.5 | Crystal violet |
| 0.5 | t-butylhydroquinone |
| 300 | MIBK/toluene mixture (1:1) |

The above-explained resin composition was employed in the preparation of a pattern in the same manner as in Example 9.

The obtained pattern was clear, with a resolving power of 50 μm.

Then the specimen was subjected to post-exposure and heating in the same manner as in Example 9. A cross-cut tape peeling test showed complete adhesion of 100/100, except for evident scars caused by cross-cutting.

Also the substrate was boiled for 8 hours in NaOH aqueous solution of pH=9.0, and was subjected again to a cross-cut tape peeling test and a peeling test of a pattern portion of 50 μm. In either test there was not observed any deterioration in adhesion such as peeling or film separation from the substrate. Also there was not observed any change in the film quality, such as whitening.

EXAMPLE 11

The photo-crosslinkable linear polymer LP-3 and the epoxy half ester HE-4 were employed in the preparation of an active energy ray curable resin composition in the following manner, wherein the amounts are represented by parts by weight:

| | |
|---|---|
| 100 | LP-3 |
| 120 | HE-4 |
| 60 | Aronix M-7100 (a polyester acrylate produced by Toa Gosei Kagaku Co., Ltd.) |
| 10 | Irgacure 651 |
| 7.0 | 2-ethyl-4-methylimidazole |
| 0.5 | Crystal violet |
| 0.5 | t-butylhydroquinone |
| 300 | MIBK/toluene mixture (1:1) |

Said composition was coated, with a bar coater, on a silicon wafer bearing an SiO$_2$ oxide layer thereon, so as to obtain a thickness of 50 μm after drying. Subsequently a resolution test pattern was formed in the same manner as in Example 9. The obtained pattern precisely reproduced the lines and spaces of 50 μm.

Subsequently said silicon wafer was dried by heating, and subjected to a post-exposure of 10 J/cm$^2$ with the same UV source as employed in the pattern exposure. A cross-cut tape peeling test conducted on said silicon wafer did not show any peeling of the coated layer.

Also said substrate was boiled for 8 hours in NaOH aqueous solution of pH=9.0, and was subjected again to a cross-cut tape peeling test and a peeling test of a pattern portion of 50 µm. In either test there was not observed any deterioration in adhesion such as peeling or film separation from the substrate. Also there was not observed any change in the film quality, such as whitening.

EXAMPLE 12

The thermo-crosslinkable linear polymer LP-2, the epoxy half esters HE-1, HE-3 and HE-5 were employed in the preparation of an active energy ray curable resin composition in the following manner, wherein the amounts are represented by parts by weight:

| | |
|---|---|
| 100 | LP-2 |
| 40 | HE-3 |
| 50 | HE-5 |
| 90 | Kaya-Cure DPCA-60 (aliphatic polyfunctional acrylate produced by Nippon Kayaku Co.) |
| 10 | Irgacure 651 |
| 0.5 | Copper phthalocyanine |
| 0.5 | t-butylhydroquinone |
| 300 | MIBK/toluene mixture (1:1) |

1% ethanolic solution of γ-mercaptopropyltrimethoxysilane, which is a silane coupling agent containing thiol radicals, was coated on a Pyrex glass plate of 10×10 cm by means of rotation with a spinner for 25 seconds at 2500 rpm. Then said glass plate was heat treated for 10 minutes at 120° C. Separately mill dispersion of the above-mentioned resin composition was coated with a wire bar on a polyethylene terephthalate film of a thickness of 16 µm, and dried for 20 minutes at 100° C. to obtain a resin composition layer of a thickness of 50 µm. Subsequently said film was laminated on said Pyrex glass plate, by means of a laminator known under the trade name HRL-24 produced by Du Pont, at 120° C. and at a peripheral speed of 1 m/min. Then a blue-colored clear pattern with lines and spaces each 50 µm wide was formed in the same manner as in Example 9.

Subsequently a post-exposure of 10 J/cm$^2$ and a heat treatment for 15 minutes at 150° C. were conducted to complete the curing. A cross-cut tape peeling test showed complete adhesion of 100/100, except for evident scars caused by cross-cutting.

Also said substrate was boiled for 8 hours in NaOH aqueous solution of pH=9.0. After boiling, the substrate was again subjected to a cross-cut tape peeling test and a peeling test of a pattern portion of 50 µm wide. In either test there could not be observed any deterioration in adhesion, such as peeling or film separation from the substrate. Also there was not observed any change in the film quality, such as whitening.

EXAMPLE 13

The resin composition of Example 10 was coated, with a bar coater, onto a polyethylene terephthalate film (Lumilar T) of a thickness of 16 µm to obtain a laminated resin composition layer of a thickness of ca. 50 µm after drying. Drying was conducted for 10 minutes in a hot air oven of 100° C. Separately a copper-laminated substrate for printed wiring board was polished with a brush and dried, and the active energy ray curable resin composition layer of the above-explained laminated film was laminated on the copper layer. The lamination was conducted with a hot roll laminator HRL-24 produced by E. I. Du Pont de Nemeur at 105° C. with a peripheral speed of 1 m/min. After the board was cooled, the resin composition layer was exposed, for 45 seconds, to the highly parallel light beam from a light source with a UV energy of 12 mW/cm$^2$ in the vicinity of 365 nm, through a resolution test negative mask. After said exposure, the masking film and the polyethylene terephthalate film were removed, and the resin composition layer was developed for 60 seconds by spraying 1,1,1-trichloroethane. In this manner there was precisely formed, on the substrate, a pattern of lines and spaces each 40 µm wide. The substrate was then subjected to post-curing with a high-pressure mercury lamp of a UV energy of 80 mJ/cm$^2$ in the vicinity of 365 nm, followed by thermal curing for 30 minutes at 120° C. After said post-curing, the pattern formed on the substrate was formed of a hard film.

A cross-cut tape peeling test conducted on the substrate revealed high adhesion of 100/100.

Said substrate was then subjected to electro-lytic copper plating for 30 minutes at 45° C. in a copper sulfate plating solution of pH=1.2. A cross-cut tape peeling test conducted on said substrate showed a high adhesion of 100/100. A high acid resistance was confirmed as the peeling was not observed even in a pattern portion which had functioned as a resist for copper sulfate plating liquid.

Also said substrate was dipped in NaOH aqueous solution of pH=12.0, and was subjected to electrolytic washing for 2 minutes, with a voltage of 10V and a current of 1 A/dm$^2$ applied through electrodes mounted on said substrate. A cross-cut tape peeling test conducted on said substrate revealed satisfactory adhesion of 100/100. High alkali resistance was confirmed from the fact that no peeling could be observed even in a pattern portion which had functioned as a resist for electrolytic washing.

Furthermore, said substrate was immersed for 15 seconds in a solder bath of 260° C. composed of Pb 60% and Sn 40%, thus applying solder to the copper foil exposed area. A cross-cut tape peeling test conducted on said substrate revealed satisfactory adhesion of 100/100. Sufficient thermal resistance as solder resist was confirmed from the fact that no peeling could be observed even in the pattern portion which had functioned as a resist for soldering.

REFERENCE EXAMPLE 3

An active energy ray curable resin composition was prepared in the same manner as in the Example 9, except that the epoxy half-ester HE-1 was replaced by 80 parts by weight of UE-8200, which was presumably an acrylate ester of Epicron 855 and was produced by Dai-Nippon Ink Chemical Industries Co., Ltd. Said composition was employed in the preparation of a pattern in the same manner as in Example 9. There was thus obtained a resolution of 50 µm and a sensitivity comparable to that in Example 9.

However, a cross-cut tape peeling test conducted on said substrate showed insufficient adhesion of 30/100.

Also said substrate was boiled for 4 hours in NaOH aqueous solution of pH=9.0. Peeling over the entire surface was observed even prior to the peeling test.

REFERENCE EXAMPLE 4

An active energy ray curable resin composition was prepared in the same manner as in Example 9, except that 120 parts by weight of Aronix M8060 were replaced by 40 parts by weight of the epoxy half-ester HE-2 and 40 parts by weight of the epoxy half-ester HE-3. Said composition was employed in the preparation 10 of a pattern in the same manner as in Example 9. The obtained pattern showed satisfactory adhesion of 100/100, but the preparation of a pattern of 100 μm required an exposure time of 90 seconds, and the precision of the obtained pattern was inferior.

We claim:

1. An active energy ray-curable resin composition comprising:
   (i) a linear copolymer containing as a first component no smaller than 60 mole percent of a monomer (A) selected from the group consisting of an alkyl methacrylate having 1 to 4 carbon atoms in the alkyl radical, acrylonitrile and styrene and containing as a second component no greater than 40 mole percent of a hydrophilic monomer selected from the group consisting of (B) a hydroxyl containing acrylic monomer, (C) an amino or alkylamino containing acrylic monomer, (D) a carboxyl containing acrylic or vinyl monomer, (E) N-vinylpyrrolidone or a derivative thereof, and (F) vinylpyridine or a derivative thereof, said linear copolymer having a glass transition temperature at least equal to 50° C. and a weight-average molecular weight of at least about $3.0 \times 10^4$; and
   (ii) a resin obtained by esterifying with an unsaturated carboxylic acid, a part of epoxy groups present in an epoxy resin comprising at least one compound having at least two epoxy groups in a molecule, said unsaturated carboxylic acid having an acrylic or methacrylic being carried out at a temperature within a range of 80° to 120° C. in the co-presence of an addition catalyst and a polymerization inhibitor such that the ratio of the epoxy groups in said epoxy resin to the carboxyl groups in said unsaturated carboxylic acid is 1: 0.3 to 1: 0.7, and said epoxy resin being selected from the group consisting of bisphenol A epoxy resins, novolac epoxy resins, alicyclic epoxy resins, bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxy-urethane resins represented by the general formula III:

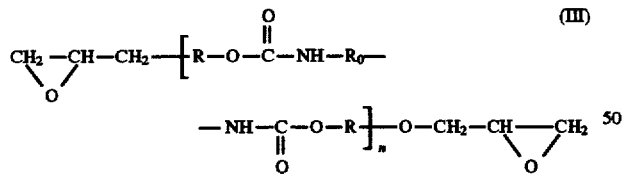

wherein R represents an alkyl group or an oxyalkyl group; and $R_O$ represents

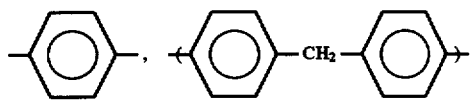

or an alkyl group.

2. An active energy ray-curable resin composition according to claim 1, wherein said component (ii) is a resin obtained by esterifying 0.45–0.55 equivalent, out of every equivalent of the epoxy groups present in said epoxy resin.

3. An active energy ray-curable resin composition according to claim 1, wherein said linear polymer (i) is contained in an amount of 20 to 80 parts by weight, and said resin (ii) is contained in an amount of 80 to 20 parts by weight.

4. An active energy ray-curable resin composition according to claim 1, further comprising a radical polymerization initiator, to be activated by the effect of an active energy ray, in an amount of 0.1 to 20 parts, by weight, with respect to 100 parts by weight in total, of said linear polymer (i) and said resin (ii).

5. An active energy ray-curable resin composition according to claim 1, further comprising a photosensitive aromatic onium salt compound containing an element of the group VIa or Va of the periodic table in an amount of 0.2 to 15 parts by weight, with respect to 100 parts by weight in total of said linear polymer (i) and said resin (ii).

6. An active energy ray-curable resin composition comprising:
   (i) a linear copolymer containing as a first component no smaller than 60 mole percent of a monomer (A) selected from the group consisting of an alkyl methacrylate having 1 to 4 carbon atoms in the alkyl radical, acrylonitrile and styrene and containing as a second component no greater than 40 mole percent of a hydrophilic monomer selected from the group consisting of (B) a hydroxyl containing acrylic monomer, (C) an amino or alkylamino containing acrylic monomer, (D) a carboxyl containing acrylic or vinyl monomer, (E) N-vinylpyrrolidone or a derivative thereof, and (F) vinylpyridine or a derivative thereof, said linear copolymer having a glass transition temperature at least equal to 50° C. and a weight-average molecular weight of at least about $3.0 \times 10^4$;
   (ii) a resin obtained by esterifying, with an unsaturated carboxylic acid, a part of epoxy groups present in an epoxy resin comprising at least one compound having at least two epoxy groups in a molecule, said unsaturated carboxylic acid having an acrylic or methacrylic vinyl group on at least one terminal end thereof and a carboxyl group on the other terminal end, said esterification being carried out at a temperature within a range of 80° to 120° C. in the co-presence of an addition catalyst and a polymerization inhibitor such that the ratio of the epoxy groups in said epoxy resin to the carboxyl groups in said unsaturated carboxylic acid is 1: 0.3 to 1: 0.7, and said epoxy resin being selected from the group consisting of bisphenol A epoxy resins, novolac epoxy resins, alicyclic epoxy resins, bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxy-urethane resins represented by the general formula III:

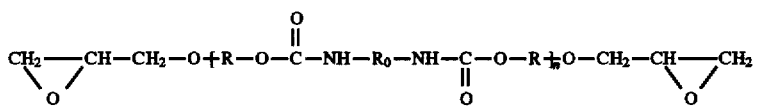

(III)

wherein R represents an alkyl group or an oxyalkyl group; and $R_O$ represents

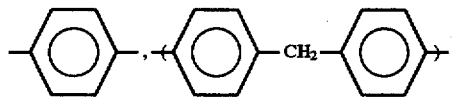

or an alkyl group; and (iii) a monomer having at least one ethylenic unsaturated bond.

7. An active energy ray-curable resin composition according to claim 6, wherein said linear polymer (i) is contained in an amount of 20 to 80 parts by weight, and said resin (ii) and said monomer (iii) are contained in a total amount of 80 to 20 parts by weight.

8. An active energy ray-curable resin composition according to claim 6, wherein the ratio of amounts of said resin (ii) and said monomer (iii) is in a range from 30:70 to 70:30.

9. An active energy ray-curable resin composition according to claim 6, further comprising a radical polymerization initiator to be activated by the effect of the active energy ray in an amount of 0.1 to 20 parts by weight, with respect to a total amount of 100 parts by weight of said linear polymer (i), said resin (ii) and said monomer (iii).

10. An active energy ray-curable resin composition according to claim 6, further comprising a photosensitive aromatic onium salt compound containing an element of the group VIa or Va of the periodic table, in an amount of 0.2 to 15 parts by weight, with respect to a total amount of 100 parts by weight of said linear polymer (i), said resin (ii) and said monomer (iii).

11. An active energy ray-curable resin composition according to claim 6, wherein said monomer (iii) has at least two such ethylenically unsaturated bonds and is selected from the group consisting of acrylic or methacrylic acid esters of a polyfunctional epoxy resin having at least two epoxy groups, acrylic or methacrylic acid esters of alkylene oxide addition products of polyhydric alcohols, acrylates of polyester comprising dibasic acid and dihydric alcohol and having molecular weight of 500–3000 and reaction products of polyisocyanates and hydroxyl-containing acrylic acid monomers.

12. An active energy ray-curable resin composition comprising:

(i) a linear copolymer containing no smaller than 60 mole percent of a monomer selected from the group consisting of an alkyl methacrylate having 1 to 4 carbon atoms in the alkyl radical, acrylonitrile and styrene and containing no greater than 40 mole percent of a monomer represented by the general formula I:

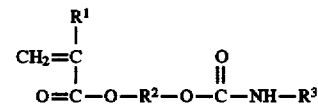

wherein $R^1$ is hydrogen or an alkyl having 1 to 3 carbon atoms; $R^2$ is a bivalent hydrocarbon group which may contain therein an ether bond or may be substituted with halogen atoms; and $R^3$ is an alkyl having 3 to 12 carbon atoms, phenylalkyl, phenyl or 5 to 30 mole percent of a monomer represented by the general formula II:

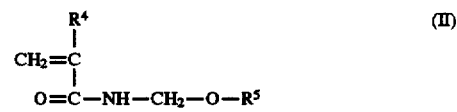

wherein $R^4$ is hydrogen, alkyl or hydroxyalkyl having 1 to 3 carbon atoms; and $R^5$ is hydrogen, alkyl or acyl having 1 to 4 carbon atoms and optionally containing a hydroxyl group, said linear copolymer having a glass transition temperature at least equal to 50° C. and a weight-average molecular weight of at least about $3.0 \times 10^4$; and (ii) a resin obtained by esterifying with an unsaturated carboxylic acid, a part of epoxy groups present in an epoxy resin comprising at least one compound having at least two epoxy groups in a molecule, said unsaturated carboxylic acid having an acrylic or methacrylic vinyl group on at least one terminal end thereof and a carboxyl group on the other terminal end, said esterification being carried out at a temperature within a range of 80° to 120° C. in the co-presence of an addition catalyst and a polymerization inhibitor such that the ratio of the epoxy groups in said epoxy resin to the carboxyl groups in said unsaturated carboxylic acid is 1: 0.3 to 1: 0.7 and said epoxy resin being selected from the group consisting of bisphenol A epoxy resins, novolac epoxy resins, alicyclic epoxy resins, bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxy-urethane resins represented by the general formula III:

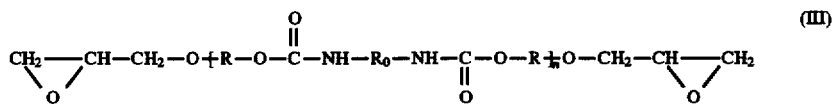

wherein R represents an alkyl group or an oxyalkyl group; and $R_O$ represents

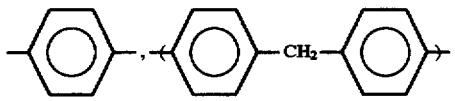

or an alkyl group.

13. The resin further composition according to claim 12, further comprising (iii) a monomer having at least one ethylenic unsaturated bond.

14. The resin composition according to claim 13, wherein said monomer (iii) has a boiling point of 100° C. or higher under atmospheric pressure.

15. The resin composition according to claim 13, wherein said monomer (iii has at least two ethylenic unsaturated bonds.

16. The reason composition according to claim 12, further comprising a radical polymerization initiator.

17. The resin composition according to claim 12, further comprising an aromatic onium chloride.

18. An active energy ray-curable resin composition comprising:
  (i) a linear copolymer containing as a first component at least 60 mole percent of a monomer selected from an alkyl methacrylate having 1 to 4 carbon atoms in the alkyl radical and containing as a second component no greater than 40 mole percent of a hydrophilic monomer selected from an amino- or alkylamino-containing acrylic monomer, said linear copolymer having a glass transition temperature of at least 50° C. and a weight-average molecular weight of at least about $3.0 \times 10^4$; and
  (ii) a resin obtained by esterifying with an unsaturated carboxylic acid, a part of epoxy groups present in an epoxy resin comprising at least one compound having at least two epoxy groups in a molecule, said unsaturated carboxylic acid having an acrylic group on at least one terminal end thereof and a carboxylic group on the other terminal end, said esterification being carried out at a temperature within a range of 80° to 120° C. in the copresence of an addition catalyst and a polymerization inhibitor such that the ratio of the epoxy groups in said epoxy resin to the carboxyl groups in said unsaturated carboxylic acid is 1: 0.3 to 1: 0.7, and said epoxy resin being selected from bisphenol A epoxy resins.
  (iii) a polyester acrylate having a boiling point of 100° C. or higher at atmospheric pressure having at least two ethylenically unsaturated bonds; and
  (iv) a radical polymerization initiator.

19. The active energy ray-curable resin composition according to any one of claims 1, 6, 12 and 18, wherein the addition catalyst comprises triethylbenzylammonium chloride.

20. The active energy ray-curable resin composition according to any one of claims 1, 6, 12 and 18, wherein the polymerization inhibitor comprises hydroquinone.

* * * * *

UNITED STATES PATENT AND TRADEMARK OFFICE
CERTIFICATE OF CORRECTION

PATENT NO. : 5,696,177

DATED : December 9, 1997

INVENTOR(S): HIROMICHI NOGUCHI ET AL.

It is certified that error appears in the above-identified patent and that said Letters Patent is hereby corrected as shown below:

COLUMN 6
 Line 52, "Epictone 800" should read --Epicrone 800--.

COLUMN 9
 Line 43, "$C_1$-C12" should read --$C_1$-$C_{12}$--.

COLUMN 12
 Ex. h), " 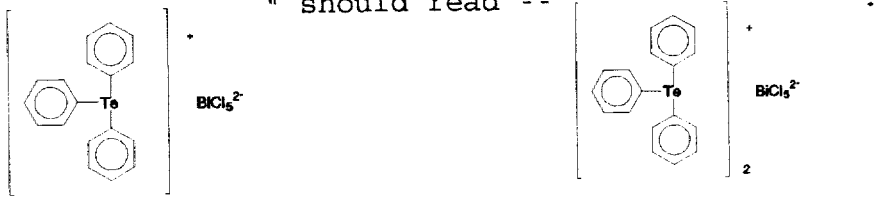 " should read -- --.

COLUMN 13
 Ex. 9), "  " should read -- --.

UNITED STATES PATENT AND TRADEMARK OFFICE
CERTIFICATE OF CORRECTION

PATENT NO. : 5,696,177

DATED : December 9, 1997

INVENTOR(S) : HIROMICHI NOGUCHI ET AL.

It is certified that error appears in the above-identified patent and that said Letters Patent is hereby corrected as shown below:

COLUMN 18
  Line 2, "equivalents" should read --equivalent--;
  Line 3, "to" should read --to 1--.

COLUMN 19
  Line 62, "Pyrax" should read --Pyrex--;
  Line 66, "be" should be deleted.

COLUMN 26
  Line 22, "electro-lytic" should read --electrolytic--.

COLUMN 27
  Line 4, "10" should be deleted;

Form (III), "$CH_2-CH-CH_2\underset{O}{\diagdown\diagup}\left[R-O-\overset{O}{\underset{\|}{C}}-NH-R_0-\right.$" should read --$CH_2-CH-CH_2-O\underset{O}{\diagdown\diagup}\left[R-O-\overset{O}{\underset{\|}{C}}-NH-R_0-\right]$--.

UNITED STATES PATENT AND TRADEMARK OFFICE
CERTIFICATE OF CORRECTION

PATENT NO. : 5,696,177

DATED : December 9, 1997

INVENTOR(S) : HIROMICHI NOGUCHI ET AL.

It is certified that error appears in the above-identified patent and that said Letters Patent is hereby corrected as shown below:

COLUMN 31
  Line 1, "further" should be deleted;
  Line 8, "(iii" should read --(iii)--;
  Line 10, "reason" should read --resin--;
  Line 24, "and" should be deleted.

COLUMN 32
  Line 7, "copresence" should read --co-presence--;
  Line 11, "reins." should read --resins;--.

Signed and Sealed this

Twenty-third Day of June, 1998

Attest:

BRUCE LEHMAN

Attesting Officer

Commissioner of Patents and Trademarks